US012469943B2

(12) United States Patent
Parow-Souchon et al.

(10) Patent No.: US 12,469,943 B2
(45) Date of Patent: Nov. 11, 2025

(54) RADIO FREQUENCY MODULE

(71) Applicant: United Kingdom Research and Innovation, Swindon (GB)

(72) Inventors: Kai Parow-Souchon, Oxfordshire (GB); Manju Henry, Oxfordshire (GB)

(73) Assignee: United Kingdom Research and Innovation, Swindon Wiltshire (GB)

( * ) Notice: Subject to any disclaimer, the term of this patent is extended or adjusted under 35 U.S.C. 154(b) by 152 days.

(21) Appl. No.: 18/271,272

(22) PCT Filed: Jan. 7, 2022

(86) PCT No.: PCT/EP2022/050260
§ 371 (c)(1),
(2) Date: Jul. 7, 2023

(87) PCT Pub. No.: WO2022/148835
PCT Pub. Date: Jul. 14, 2022

(65) Prior Publication Data
US 2024/0304973 A1   Sep. 12, 2024

(30) Foreign Application Priority Data
Jan. 8, 2021 (GB) .................... 2100255

(51) Int. Cl.
*H01P 3/08* (2006.01)
*H05K 1/02* (2006.01)
(52) U.S. Cl.
CPC .......... *H01P 3/081* (2013.01); *H05K 1/0243* (2013.01); *H05K 1/0277* (2013.01)

(58) Field of Classification Search
CPC ..... H01P 3/081; H05K 1/0243; H05K 1/0277
USPC ........................................... 333/100
See application file for complete search history.

(56) References Cited

U.S. PATENT DOCUMENTS

| 5,929,728 | A | 7/1999 | Barnett et al. |
| 6,285,335 | B1 | 9/2001 | Snygg et al. |
| 8,912,860 | B2 | 12/2014 | Leiba et al. |
| 9,791,321 | B2 | 10/2017 | Chattopadhyay et al. |
| 2012/0013499 | A1 | 1/2012 | Hayata |

FOREIGN PATENT DOCUMENTS

| JP | 2009060159 A | 3/2009 |
| JP | 2009141386 A | 6/2009 |
| SU | 1374399 A1 | 2/1988 |

OTHER PUBLICATIONS

B Kim et al. "Full W-band Power Amplifier/Combiner Utilizing GaAs Technology" 2012 IEEE/MTT-S International Microwave Symposium Digest.

(Continued)

*Primary Examiner* — Andrea Lindgren Baltzell
*Assistant Examiner* — Abigail Amir Yaldo
(74) *Attorney, Agent, or Firm* — Lempia Summerfield Katz LLC

(57) ABSTRACT

A radio frequency module is disclosed comprising: a radio frequency circuit block which comprises a stack of at least two metal plates and a plurality of radio frequency waveguides defined by channels in the metal plates so as to carry radio frequency signals within the circuit block; and one or more radio frequency processing components arranged within the circuit block to interact with the signals carried by the waveguides.

31 Claims, 11 Drawing Sheets

(56) References Cited

OTHER PUBLICATIONS

Chattopadhyay G. et al. "Micromachined Packaging for Terahertz Systems", Proceedings of the IEEE, vol. 105, issue 6, Jun. 2017.
GB Search Report from Application No. GB2100255.5, dated Jun. 7, 2021, 4 pages.
International Search Report and Written Opinion from International Patent Application No. PCT/EP2022/050260, dated May 11, 2022, 15 pages.
International Search Report and Written Opinion of the International Searching Authority from International Patent Application No. PCT/EP2022/050260, dated May 19, 2022, 11 pages.

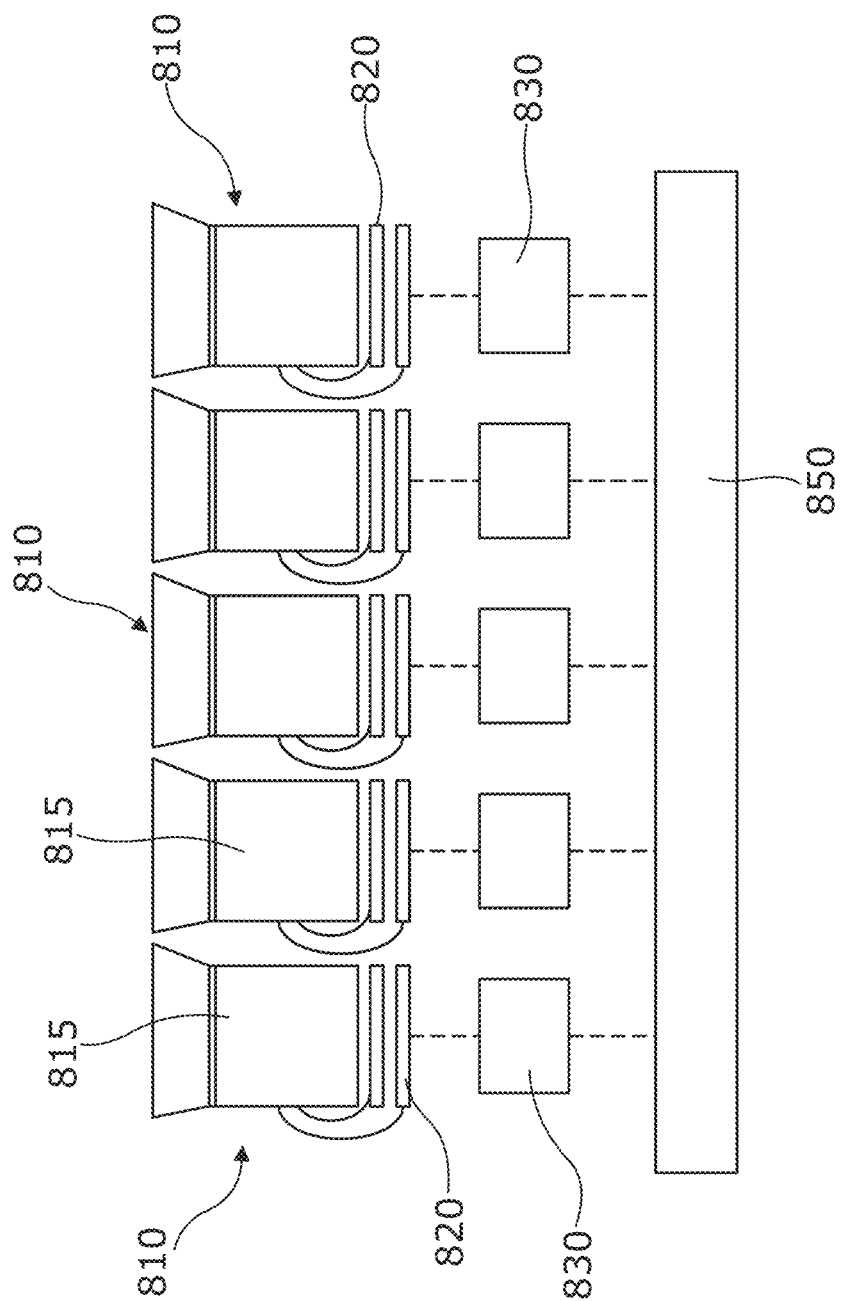

RADIO FREQUENCY MODULE

The present disclosure relates to radio frequency (RF) modules, for example RF modules for use on-board satellites.

RELATED APPLICATIONS

The present patent document is a § 371 nationalization of PCT Application Serial No. PCT/EP2022/050260, filed Jan. 7, 2022, designating the United States, which is hereby incorporated by reference, and this patent document also claims the benefit of United Kingdom Application No. GB 2100255.5, filed Jan. 8, 2021, which is also hereby incorporated by reference.

INTRODUCTION

At millimeter/submillimeter frequencies, planar transmission lines have low voltage ratings, and tend to suffer from large parasitic power losses due to conductor "skin" and dielectric effects. In waveguides, the electromagnetic waves are guided and therefore energy leakage can be largely eliminated, allowing high power signals and wide bandwidths. In these frequency ranges, instruments such as radiometers and radar tend to use conventional waveguide modules along with coaxial interconnections.

However, miniaturization of such systems is important for example to allow the development of new applications for microwave radiometers and instruments. One field of application is in the deployment of Earth observation satellites such as CubeSats. These satellite platforms tend to impose strict limitations on size and mass of instruments, for example in up to about six discrete units of about 100×100× 100 $mm^3$ in size. It would be desirable to address problems and limitations of the related prior art.

SUMMARY OF THE INVENTION

The invention provides an improved architecture for radio frequency modules which allows for very compact designs along with high performance in terms of sensitivity, power, signal to noise ratio and other relevant considerations. Radio frequency functions are stacked within a series of parallel metal plates brought together to form a radio frequency circuit block, in which radio frequency interconnections between the different functions are provided in waveguide form within the circuit block. Flexible circuit board connections between the interior of the circuit block and exterior elements such as support circuit boards can be used, especially for lower frequency signals, and such support circuit boards can be vertically stacked with the metal plates of the circuit block to form a particular compact and high performance module.

Waveguides and other spaces within the circuit block, for example spaces to accept processing components, microstrip transition circuits and intermediate frequency units, can be accurately formed for example by CNC milling techniques.

The invention can be used to provide functionally independent standalone RF modules, or modules which can be combined together into a larger system. Using a compact and regular form of the modules can promote good use of space in stacking or providing groups of arrays of such modules, for example in phase array applications.

In particular, the invention provides a radio frequency module comprising: a radio frequency circuit block which comprises a stack of at least two, or at least three metal plates, and a plurality of radio frequency waveguides defined by channels in the metal plates so as to carry radio frequency signals within the circuit block; and one or more radio frequency processing components arranged within the circuit block to interact with the signals carried by the waveguides.

The metal plates may typically be planar, parallel and in face to face contact with each other so as to form a continuous unit within which the waveguides extend to carry the radio frequency signals. At least three, and optionally all, of the metal plates may define a portion or a surface of at least one of the radio frequency waveguides.

The processing components may be active components such as integrated circuits, passive components such as diodes or functional waveguide or strip line arrangements, or a mixture of passive and active components.

The radio frequency module may then further comprise one or more support circuit boards, each support circuit board being in electrical communication with at least one of the processing components. At least one, and optionally all of the support circuit boards may be stacked in series with the metal plates.

Each adjacent pair of metal plates in the stack may define a mutual plate boundary, and a different one of the radio frequency processing components may then be located at each of at least two, at least three, or optionally all of the mutual plate boundaries.

The radio frequency module may further comprise one or more flexible circuit boards or flexible printed circuit boards coupled to the radio frequency circuit block, for example extending from the outside to the inside of the radio frequency circuit block. These flexible printed circuit boards may be used for various purposes, but typically each may provide electrical connection between one or more of the radio frequency components (most typically active ones of the radio frequency components) to elements outside of the circuit block. Such a flexible printed circuit board may for example provide electrical communication between one or more of the support circuit boards and one or more of the processing components.

One, more than one, or all of the flexible printed circuit boards may in particular be arranged or installed as part of the radio frequency module with a significant curvature of the main plane of the PCB, for example with a radius of curvature which is less than 100 mm, or less than 50 mm.

In some aspects, the invention provides an above radio frequency module in which the radio frequency circuit block comprises a stack of at least three of the metal plates and a plurality of the radio frequency waveguides defined by channels in the metal plates so as to carry radio frequency signals within the circuit block. The metal plates may typically be planar, parallel and in face to face contact with each other so as to form a continuous unit within which the waveguides extend to carry the radio frequency signals.

One or more of the radio frequency processing components may then be disposed within the circuit block to interact with the signals carried by the waveguides. These processing components may be active such as integrated circuits, passive such as diodes or waveguide structures, or a mixture of the two.

One or more support circuit boards may then be provided, each in electrical communication with at least one of the processing components. In particular, the support circuit boards may be stacked in series with the metal plates, for example each support circuit board being parallel to the metal plates.

The radio frequency modules discussed may for example be arranged to handle radio frequency signals which have frequencies in the range 10 GHz to 400 GHz, and in particular the waveguides within the circuit block may be adapted or constructed for this range.

The modules discussed may further comprise one or more of the flexible printed circuit boards, or Flex PCBs, for example wherein each support circuit board is in electrical communication with at least one of the processing components via a said flexible printed circuit board extending from the relevant support circuit board into the circuit block.

Conveniently, one or more of the processing components may be mounted on a said flexible printed circuit board within the circuit block, or may be closely coupled to or adjacent to such a flexible printed circuit board.

A plurality of mounting rods may be provided, each mounting rod passing through a series of aligned apertures in all of the metal plates, and one or more of the mounting rods may then also pass through a corresponding mounting aperture in each of the support circuit boards which are stacked in series with the metal plates. The mounting rods may be at least partly threaded so as to accept nuts to secure the metal plates together and to fix the support circuit boards in place.

Each metal plate may have the same form factor as the other metal plates, and optionally wherein some or all of the support circuit boards have the same form factor as the metal plates. Typically, the form factor may be a square or rectangular form factor but other shapes may be used.

Each metal plate of the stack, and optionally also each of some or all of the support circuit boards, may be of substantially the same shape and size, at least in plan view. For example, each metal plate in the stack may be of sufficiently similar shape and size to overlap with all the other metal plates in plan view by at least 90% surface area. Some or all of the support circuit boards may conform to the same criteria, although it may be convenient for one or more of the circuit boards to have smaller form factor, for example a half of the metal plate form factor.

The invention enables very compact and miniaturized RF modules to be formed, for example in which the top or major surface of each metal plate has a surface area of not more than 25 cm$^2$. Similarly, the stack of parallel metal plates and if present, parallel support circuit boards, may be required to be no more than 10 cm in height or depth.

One or more of the processing components may be coupled to one or more of the waveguides using one or more microstrip circuits located within the circuit block, for example microstrip circuits formed on quartz and disposed in channels within the circuit block which connect with the waveguides.

The one or more processing components may include or comprise one or more passive electrical or electronic components, such as a discrete diode, a combination of discrete diodes, a resistor or resistor network, an inductor, a capacitor, or combinations of passive components which may be mounted on a microstrip circuit or on a portion of a flexible PCB within the circuit block.

The one or more processing components may include or comprise one or more waveguide or strip line structures, typically passive such structures, for combining, dividing, or mixing the radiofrequency signals, for example a transmission line or waveguide directional coupler; a transmission line or waveguide hybrid coupler; a transmission line or waveguide power divider; and a transmission line or waveguide power combiner.

The one or more processing components may include or comprise one or more active electrical or electronic components, such as a transistor, an amplifier integrated circuit, a mixer integrated circuit, a filter integrated circuit, or a MEMS device. Again, such components may be mounted on a microstrip circuit or on a portion of a flexible PCB within the circuit block.

The processing components may for example implement, within the circuit block, one or more of: an amplifier, a mixer, a frequency multiplier, and a phase shifter.

The radio frequency module may be one or more of a receiver module, a heterodyne receiver module, a transmitter module, and a transceiver module, and a phased array may be provided comprising a plurality of said radio frequency modules.

The invention also provides methods corresponding to the above apparatus, for example a method of constructing a radio frequency module comprising stacking a plurality of metal plates to form a radio frequency circuit block which comprises a plurality of radio frequency waveguides defined by channels in the metal plates so as to carry radio frequency signals within the circuit block, while disposing one or more radio frequency processing components within the circuit block to interact with the signals carried by the waveguides. The method may then further comprise mounting one or more support circuit boards so as to be stacked in series with the metal plates, each support circuit board being in electrical communication with at least one of the processing components within the circuit block. Typically, the plates of the circuit block may be stacked in contact with each other.

Electrical communication between the inside and the outside of the circuit block, for example between one or more of the support circuit boards and one or more of the processing components, may then be provided using one or more flexible printed circuit boards extending to or into the circuit block, and the method may further comprise mounting one or more of the processing components on one or more of said flexible printed circuit boards within the circuit block.

Although embodiments of the invention may be depicted and/or described in certain orientations, for example using the terms top and bottom, these orientations are not to be taken as limiting, since the described radio frequency modules can be oriented in any desirable manner, for example depending on the application, platform and other factors.

BRIEF SUMMARY OF THE DRAWINGS

Embodiments of the invention will now be described, by way of example only, with reference to the accompanying drawings of which:

FIG. 11 shows how a plurality of the described radio frequency modules may be combined within a phase array.

DETAILED DESCRIPTION OF EMBODIMENTS

Figure 1:
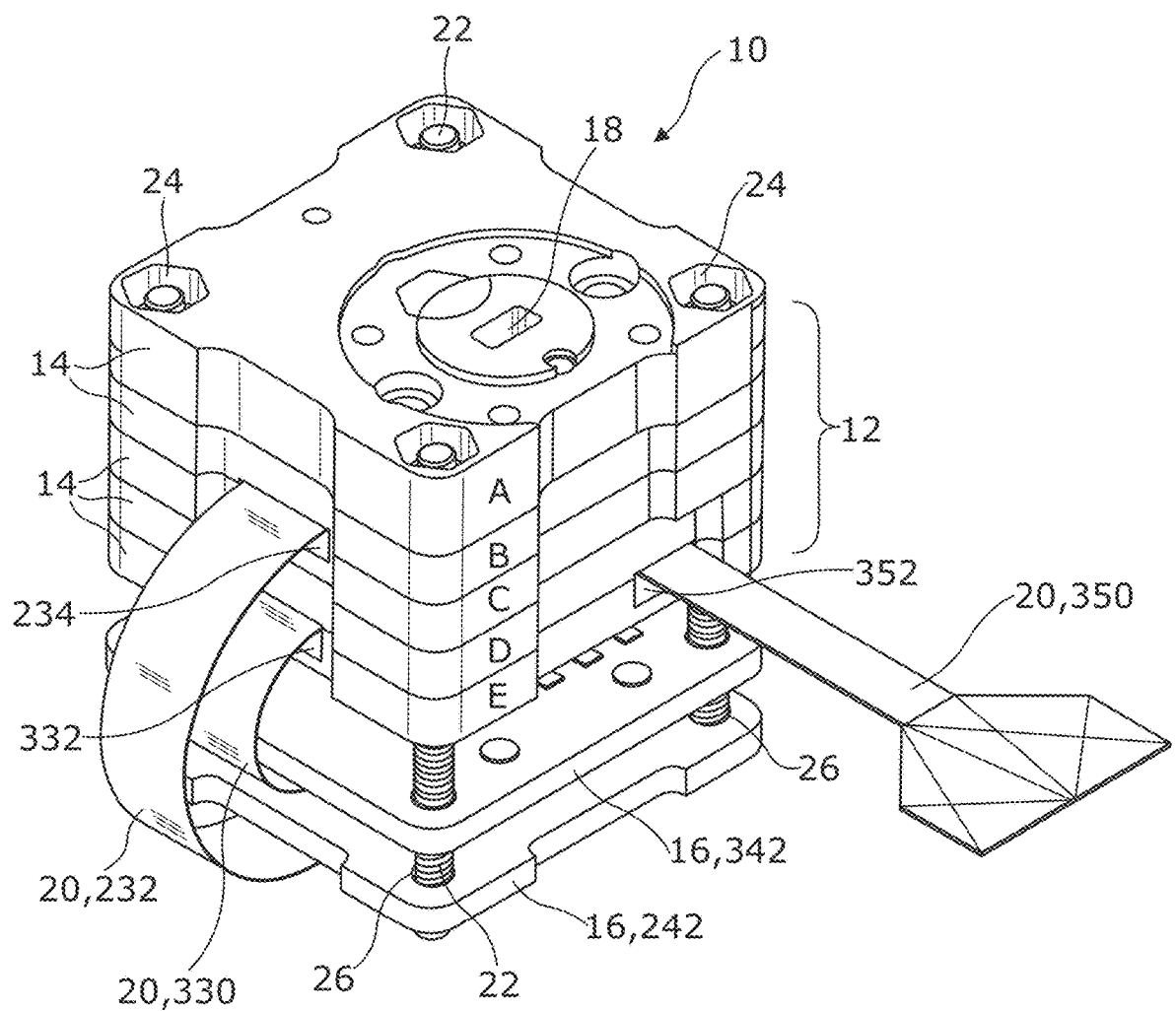
FIG. 1 illustrates in perspective view a radio frequency module combining a circuit block of parallel metal plates with one or more support circuit boards.

Referring to FIG. 1 there is illustrated a radio frequency (RF) module 10 implemented in a compact or miniaturized form. The particular module illustrated is configured to operate as a heterodyne receiver or radiometer, but similar compact modules may be designed and configured to implement other functions such as those discussed below. Such modules may be installed and used in a variety of situations, for example being carried by an orbiting satellite, an aircraft, a high altitude balloon, a radar installation, a ship or land vehicle, or by any of a variety of other moving or static platforms. Such modules may be arranged to receive and process (for example to measure) the radio waves, to generate radio waves for transmission or other processing, or both to receive and transmit. Such modules may for example receive radio waves directly from an antenna or another such module, and/or direct radio waves to an antenna for transmission, or to another such module.

The module 10 of FIG. 1 comprises a radio frequency circuit block 12 which comprises a stack of at least two, or at least three, parallel metal plates 14 (in FIG. 1 five such plates are shown), and may also comprise one or more support circuit boards 16 (in FIG. 1 there are two such support circuit boards). The support circuit boards 16 as shown in FIG. 1 are mounted so as to be parallel to and stacked in series with the metal plates 14, although other mounting locations and positions are possible as discussed below, for example see the arrangement of FIG. 8. Typically the support circuit boards if stacked in series with the metal plates will be spaced from each other and from the circuit block 12 as shown in FIG. 1, rather than being stacked in contact or in very close proximity.

The metal plates in FIG. 1 are labelled A-E for ease of discussion later in this document. Each adjacent pair of metal plates in the stack may be considered to define a mutual plate boundary, so that in the arrangement of FIG. 1 there are four such boundaries.

Within the circuit block 12 a plurality of radio frequency waveguides (visible in FIG. 1 only as an entrance port 18 through the top metal plate) are defined by channels in the metal plates, so as to carry radio frequency electromagnetic waveguide signals within the circuit block 12. In some embodiments (and most notably where there are three or more metal plates), at least three, and optionally all of the metal plates define at least a portion or surface of at least one of the radio frequency waveguides.

Also within the circuit block 12 are one or more radio frequency processing components (not visible in FIG. 1) which are arranged to interact with the waveguide signals in various ways. For example, such processing components may measure, amplify, split, mix, combine, frequency shift, otherwise transform, and/or generate such waveguide signals (note therefore that when we refer to processing components interacting with waveguide signals, this may include generation of such waveguide signals). Each such processing component may be coupled directly to the waveguide signals in the waveguides, or using coupling arrangements such as one or more microstrip transition circuits or other arrangements. In some embodiments (and most notably where there are three or more metal plates) at least one such processing component may be located at each of two or more, or at each of three or more, or at all of, the mutual boundaries between the metal plates. This condition does not necessarily require such a processing component to extend across the major plane of the boundary, because such a processing component could for example be located between the two metal plates while being contained wholly within an aperture in the boundary surface of one of the metal plates.

The waveguide signals may typically be electromagnetic signals within a frequency range from about 10-400 GHz. Below about 10 GHz the required sizes of the waveguides are increasingly large, and planar technologies are likely to be more suitable. Above about 400 GHz the alignments required between the waveguide boundaries in adjacent metal plates become critical, with very slight misalignments increasing insertion loss significantly.

In the arrangement of FIG. 1, each such support circuit board 16 is in electrical communication with one or more of the processing components within the circuit block 12. The support circuit boards 16 may send support signals to the processing components, and/or receive support signals from the processing components. Such support signals may for example provide a bias signal for an amplifier component, a local oscillator signal for a mixer component, a control signal for a switch component, a measurement of a waveguide signal from a measuring component, and so forth.

In the arrangement of FIG. 1, each support circuit board 16 is in electrical communication with one or more of the processing components within the circuit block via, or using, a connector, which may in particular be a flexible printed circuit board 20 (flexible PCB) as illustrated in FIG. 1. Each such connector or flexible PCB may extend from a support circuit board (or from another entity) to, and more preferably into (as shown in FIG. 1), the circuit block 12. For example, each such flexible PCB 20 may extend at least from an edge of one of the support circuit boards at least to an edge of one of the parallel metal plates 14, and typically further to the inside of the circuit block. By extending one or more of the flexible PCBs into the inside of the circuit block 12, a processing component can be mounted directly onto such a flexible PCB to thereby improve integration and simplify construction, or mounted adjacent to the flexible PCB. The flexible PCB can then conveniently carry circuitry for driving and/or communicating with the processing component, in addition to that provided by the related and connected support circuit board.

Note that in some embodiments, flexible PCBs may extend from the inside to the outside of the circuit block for purposes other than for connecting to support circuit boards, noting that in some embodiments there may be no support circuit boards comprised in the module 10. For example, one or more flexible PCBs may be used to provide a signal or data or power connection to or from elements outside of the radio frequency module, for example by comprising a coaxial connector for communicating a radio frequency signal, or other connection types.

The flexible PCBs enable connections between the inside of the circuit block and elements outside the circuit block to be made in a more compact but flexible manner. To this end, one, more than one, or all the flexible PCBs may be arranged or installed such that at least part of the flexible PCT has a radius of curvature of less than 100 mm, or less than 50 mm, where that radius of curvature is directed perpendicular to the main plane of the flexible PCB.

The metal plates 14 may be at least partly held together to form the circuit block 12 using a plurality of mounting rods 22, such as threaded rods, as seen in FIG. 1. Each mounting rod passes through some or all of the plates, for example through a series of corresponding aligned apertures 24 in the metal plates 14, and threaded nuts or other fastenings may then be applied to the mounting rods 22 to secure the metal plates 14 together. Dowel metal pins may also be used to ensure fine alignment of waveguide portions defined by aligned apertures in adjacent metal plates, as described in more detail below in respect of FIGS. 3 and 4.

In order to mount the support circuit boards 16 parallel to and/or stacked in series with the metal plates 14 if required, each support circuit board 16 may also comprise a plurality of mounting apertures 26, each such mounting aperture 26 corresponding to one of the mounting rods 22. By providing mounting rods 22 of sufficient length, the support circuit boards 16 can then be secured in stacked series with the metal plates 14 by means of the mounting rods 22 also passing through these mounting apertures in the support circuit boards. Threaded nuts or other fastenings can then be applied to the mounting rods to secure each support circuit board in place.

In the arrangement of FIG. 1, each metal plate 14 of the circuit block 12 is approximately square in plan view (of the major or largest face), although other shapes may be used if required, for example rectangular or hexagonal. For some applications, the ability to locate multiple such modules 10 in a closely spaced rectangular, hexagonal or other grid form may be advantageous. Typically, each support circuit board may be of approximately the same shape and size as the metal plates, or may be of a smaller size if appropriate.

The dimensions of the major or largest face each metal plate (i.e. in plan view from above) in the arrangement of FIG. 1 are approximately 2.5 cm×2.5 cm, but more generally the surface area of each major surface of each metal plate may be limited for example no more than 25 cm$^2$ or no more than 100 cm$^2$. Similarly, the widest dimension of each metal plate may be limited for example to no more than 5 cm or no more than 10 cm. Each metal plate may typically be around 2 mm to 10 mm thick, and may be made of a variety of different metals such as copper, brass or aluminum. The metal plates may be electroplated with gold to prevent oxidation.

The depth of the stack of parallel metal plates and support circuit boards as illustrated in FIG. 1 is approximately 4.0 cm, but may for example be limited to no more than 10 cm. Consequently, the volume of the module, as defined by the perimeter of the upper most metal plate and extending down around the plates and support circuit boards to the perimeter of the lowest support circuit board may limited to no more than 100 cm$^3$ or no more than 1000 cm$^3$.

More generally, the approximate shape and size in plan view of each metal plate and support circuit board may be referred to as a particular form factor. With this in mind, the module 10 may be constructed such that all of the metal plates 14, and optionally some or all of the support circuit boards are of the same form factor. To use a different definition, each metal plate of the stack, and optionally also each of some or all of the support circuit boards, may be required to overlap with all the others by at least 90% of the surface area of its major surface (i.e. in plan view). In some cases, one or more of the support circuit boards may have a different form factor, for example corresponding to about half or about one quarter of a metal plate of the stack.

Figure 2:
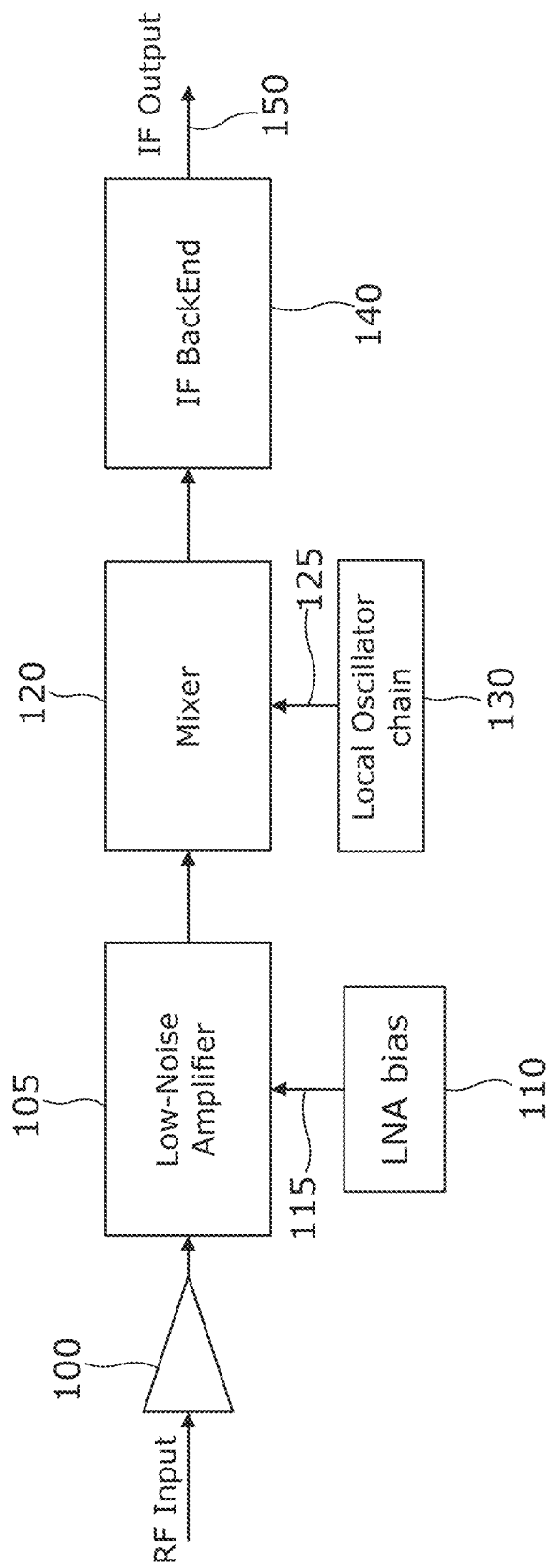
FIG. 2 is a schematic of a heterodyne receiver which may be implemented using the architecture generally shown by FIG. 1.

FIG. 2 illustrates schematically a heterodyne receiver RF circuit that may be implemented in modules such as that illustrated in FIG. 1. A radio frequency input is received for example via an antenna 100. The signal from the antenna 100 is passed to a low noise amplifier (LNA) 105 which is supported by an LNA bias 110 which provides the one or more required amplifier bias signals 115 for the low noise amplifier 105. The amplified RF signal from the low noise amplifier 105 is passed to a mixer 120 which mixes the amplified signal with a local oscillator signal 125 received from a local oscillator chain 130. The mixer then outputs the resulting intermediate frequency (IF) signal to an IF backend 140 which amplifies, conditions and otherwise processes the IF signal electronically, and outputs the IF signal as IF output 150 for further use, for example to a spectrometer, data store, or for transmission to other equipment or locations.

In implementing the receiver of FIG. 2 in the context of FIG. 1, the function of the top metal plate A seen in FIG. 1 is to couple antenna 100 into the circuit block 12. For example, a horn antenna for collecting the RF input may be mounted directly to plate A, and direct the RF input into the entrance port 18 of plate A seen in FIG. 1. An antenna spaced from the module and coupled using a suitable waveguide, may be used instead if required, or another type of RF input such as an RF input from another similarly constructed RF module, or another component or system.

Metal plates B and C of FIG. 1 are then used to implement the low noise amplifier 105 shown in FIG. 2. The aim of the low noise amplifier function is to amplify the RF input received through metal plate A with minimal noise additions. Plates B and C adapted for this function are shown separately in plan view in FIG. 3. Plate B is seen from the underside and plate C from the top side relative to the perspective view of FIG. 1. When the faces of plates B and C as shown are brought together, channels in the plates define an LNA input waveguide 210 and an LNA output waveguide 220 for the low noise amplifier 105. The LNA input waveguide 210 includes an LNA input aperture 212 which passes though the plate B and couples with the entrance port 18 of plate A to receive the RF input from the antenna 100 or other input source.

The LNA input waveguide 210 carries the RF input as an electromagnetic waveguide signal to an LNA microstrip transition circuit 230 fabricated on a quartz substrate which is located between plates B and C and which couples into both the LNA input and LNA output waveguides. The LNA microstrip transition circuit 230 is mounted onto the end of, and in electrical communication with, an LNA flexible PCB 232 which passes into the circuit block through an aperture 234 defined between plates B and C.

A processing component in the form of a low noise amplifier integrated circuit 236 (for example a Fraunhofer MMIC chip such as the ALN001 MB165TESS, or the ALN072 MB-W-TH), typically implemented as a monolithic microwave integrated circuit MMIC, is mounted on the LNA flexible PCB 232, and within the circuit block 12 between plates B and C. This integrated circuit receives the RF input from the LNA input waveguide 210 via the LNA microstrip transition circuit 230. The amplified output from the integrated circuit 236 is then delivered by the LNA flexible PCB 232 back to the LNA microstrip transition circuit 230 for injection into the LNA output waveguide 220.

As also illustrated in FIG. 1, an external end portion 240 of the LNA flexible PCB 232 connects to an LNA support circuit board 242 mounted in series with the stack of metal plates 18. The LNA support circuit board 242 implements the LNA bias 110 of FIG. 2 in generating the DC bias signals required to operate the integrated circuit 236. These DC bias signals are communicated to the integrated circuit 236 via the LNA flexible PCB 232.

Figure 4:
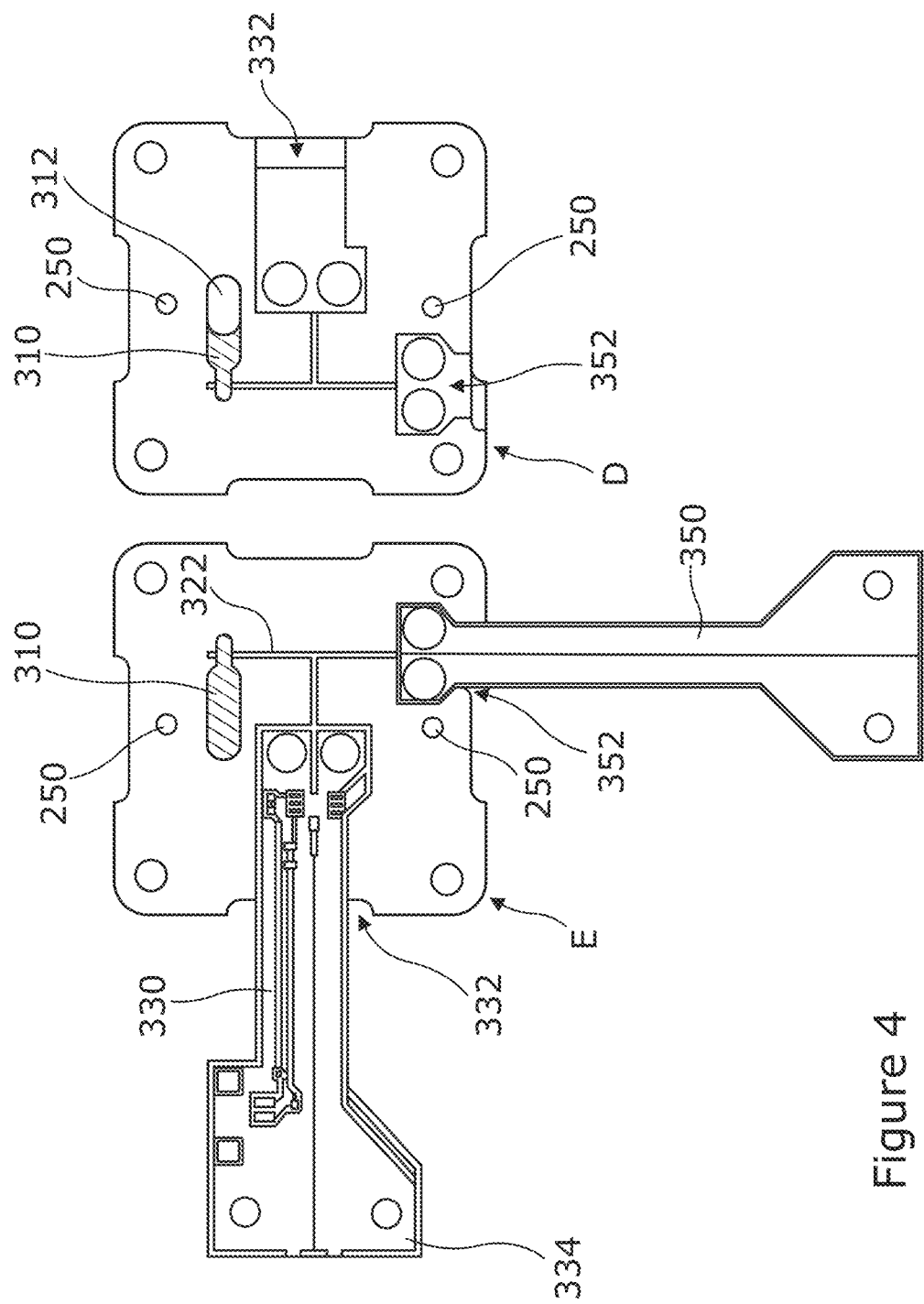
FIG. 4 shows how two further metal plates of FIG. 1 and associated flexible PCBs may be arranged in implementing the mixer of FIG. 2.

The amplified signal passes as a waveguide signal along the LNA output waveguide 220 to LNA output aperture 244 in plate C, through which it passes to enter metal plate D as illustrated in FIG. 4.

Metal plates D and E of FIG. 1 may be used to implement the mixer 120 shown in FIG. 2. The aim of the mixer is to mix the amplified RF signal with a local oscillator signal to generate an intermediate frequency signal more suitable for further processing and analysis. Plates D and E are shown separately in plan view in FIG. 4. Plate D is seen from the underside and plate E from the topside relative to the perspective view of FIG. 1.

When the faces of plates D and E as shown are brought together, channels in the plates define a mixer input waveguide 310 for the mixer function 120. The mixer input waveguide 310 includes a mixer input aperture 312 which passes though the plate D and couples with the LNA output aperture 244 of plate C seen in FIG. 3, to receive the amplified RF signal from the low noise amplifier function 105.

The mixer input waveguide 310 carries the amplified RF signal to a mixer microstrip circuit 320 fabricated on a quartz substrate. A processing component in the form of a Schottky diode 322 or pair of such diodes (typically in an antiparallel configuration) is mounted by soldering onto the mixer microstrip circuit 320, and any required diode matching circuits are also included as part of the circuit 320.

A local oscillator flexible PCB 330 passes into the circuit block 12 through an aperture 332 defined between plates D and E. An external end portion 334 of the local oscillator flex PCB 330 connects to a local oscillator support circuit board 342 mounted in series with the stack of metal plates 18, which implements the local oscillator chain 130 of FIG. 2 in providing the local oscillator signal 125 required for mixing with the amplified RF signal. In particular, the local oscillator flexible PCB 330 carries the local oscillator signal to the mixer microstrip circuit 320 for mixing with the amplified RF signal at the Schottky diode or diodes 322. The local oscillator support circuit board 342 may typically comprise a suitable frequency synthesizer integrated circuit and associated circuitry for generating the local oscillator signal.

An IF output flexible PCB 350 passes into the circuit block 12 through an aperture 352 defined between plates D and E, and couples to the mixer microstrip circuit 320 so as to receive the intermediate frequency (IF) signal from the Schottky diode. The IF output flexible PCB 350 may then either deliver the IF signal to a further support circuit board 16 (not shown in FIG. 1) mounted in series with the rest of the stack of circuit boards and metal plates, or to another circuit board or an output connector of some kind.

As mentioned above, one or more dowel pins may be used to assist in accurate alignment of adjacent metal plates of the stack so as to ensure exact or optimal positional matching between adjacent portions of a waveguide defined by channels in adjacent plates, for example to exactly align the plate B and plate C portions of LNA input waveguide 210, or the interface between the plate C LNA output aperture 244 and plate D mixer input aperture 312. Such dowel pins may typically be made of metal, and each such dowel pin may extend into two, more than two, or all of the metal plates. Two or more of these dowel pins may extend between and therefore serve to align any or all of the adjacent pairs of metal plates, although just one dowel pin may be sufficient between two plates in some circumstances.

Figure 3:
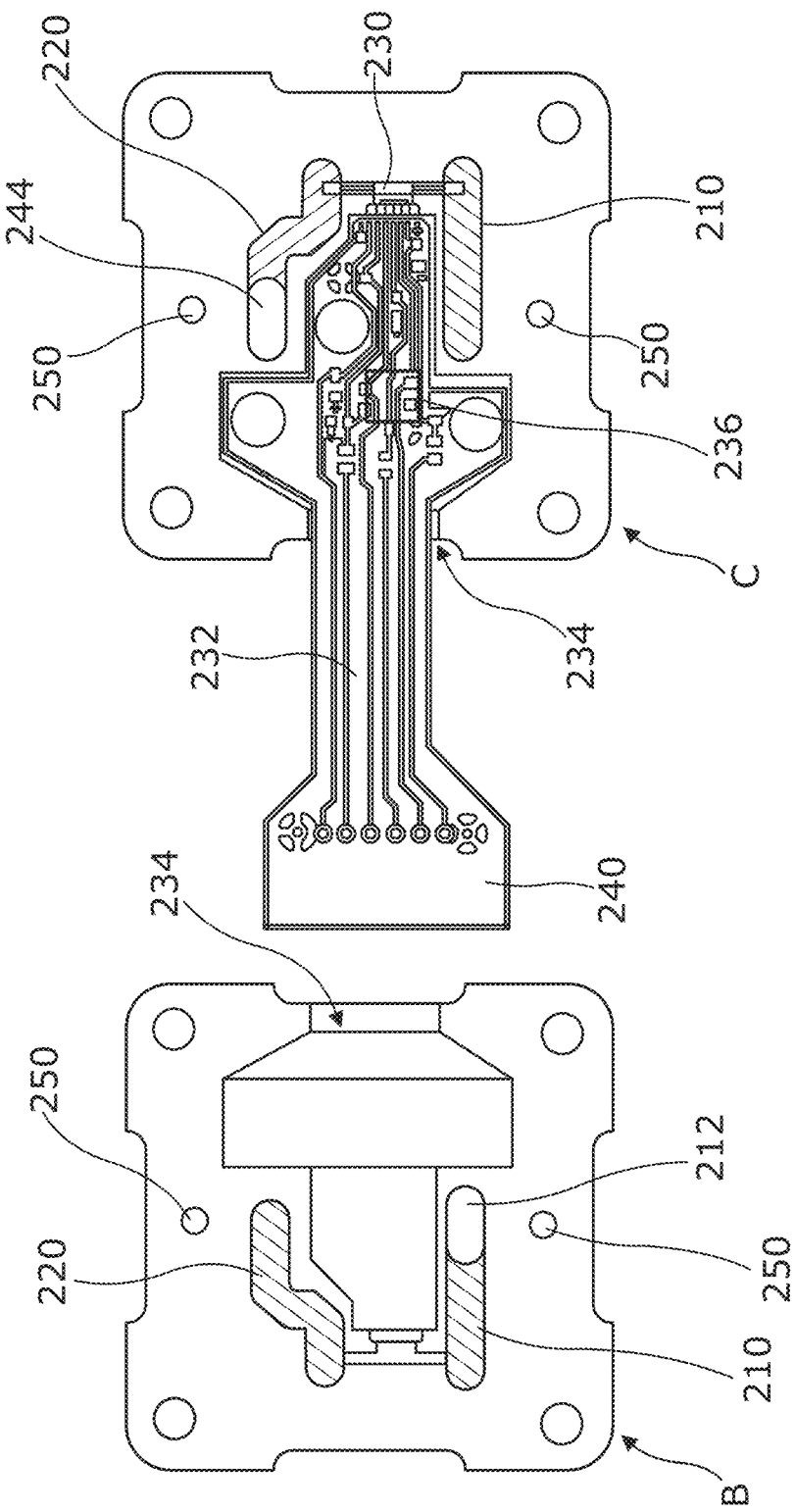
FIG. 3 shows how two metal plates of FIG. 1 and an associated flexible printed circuit board (PCB) may be arranged in implementing the low-noise amplifier of FIG. 2.

To this end, FIGS. 3 and 4 show two dowel pin apertures 250 in each of metal plates C, D, E and F, with these apertures aligning between the metal plates when brought together to form the circuit block, so as to accept dowel pins as discussed above. Similar dowel pin apertures may be provided also in plate A aligned with those shown.

Figure 5:
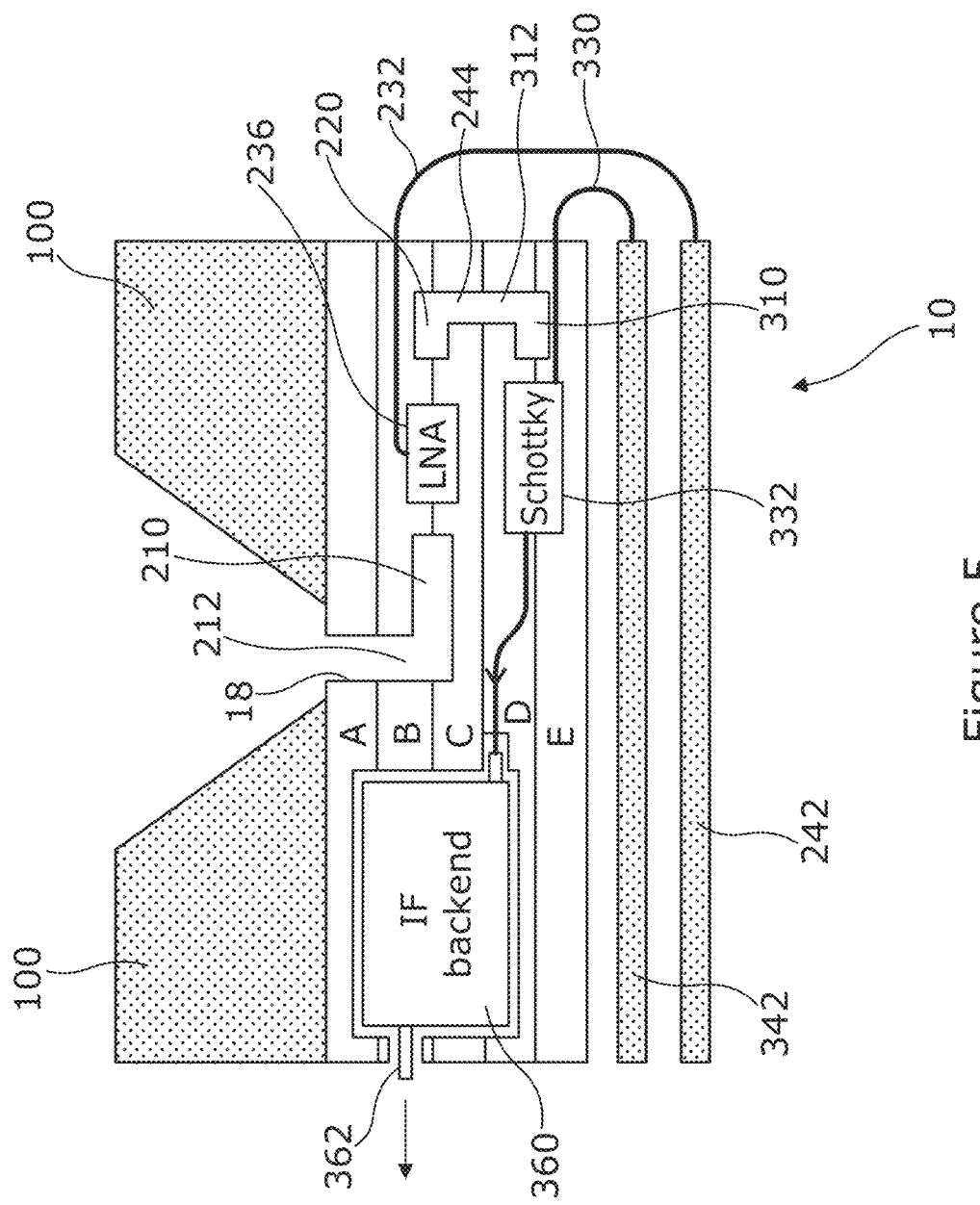
FIG. 5 is a schematic cross section of an implementation of the heterodyne receiver of FIG. 2 using the architecture generally shown in FIG. 1, and consistent with the design details of FIGS. 3 and 4.

FIG. 5 shows more schematically, and in a cross sectional form, an RF module 10 such as that of FIG. 1 adapted to implement a heterodyne receiver RF circuit such as that of FIG. 2, using the arrangements of FIGS. 3 and 4. In this figure, a pyramidal horn antenna 100 is shown as coupled directly to the first metal plate A, to deliver the RF input through entrance port 18 in plate A, through the LNA input aperture 212 in plate B, and along the LAN input waveguide 210 defined by channels in one or both of plates B and C.

The RF input is then coupled using the LNA microstrip transition circuit (not shown) or other arrangement to the LNA processing component provided by the low noise amplifier integrated circuit 236 which is mounted on or adjacent to the LNA flexible PCB 232. The LNA processing component is supplied with suitable LNA bias signals 115 communicated from the LNA support circuit board 242 via the LNA flexible PCB 232.

The amplified RF signal output of the LNA processing component 236 is then passed via the LNA microstrip transition circuit or other arrangement to the LNA output waveguide 220, and through the LNA output aperture 244 in plate C to the mixer input aperture 312 in plate D.

The amplified output passes along the mixer input waveguide 310 formed by channels in one or both of plates D and E to be coupled using the mixer microstrip circuit (not shown) to the mixer processing component mounted on the microstrip circuit which is provided by the one or more Schottky diodes 322. The mixer processing component is supplied with a suitable local oscillator signal 125 communicated from the mixer support circuit board 342 via the local oscillator flex PCB 330.

Whereas in FIG. 4 the output of the mixer processing component is coupled for output to a further flexible PCB, and in particular the IF output flexible PCB 350, in the arrangement of FIG. 5 the output is instead coupled more directly to an IF backend circuit 360 located within the circuit block itself, for example within a cavity defined by the metal plates as shown in FIG. 5. An IF backend output 362 may then be provided, for example, by a coaxial connection. Such an IF backend circuit 360 may be provided for example in the form of an LTCC (low-temperature cofired ceramic) unit.

Figure 6:
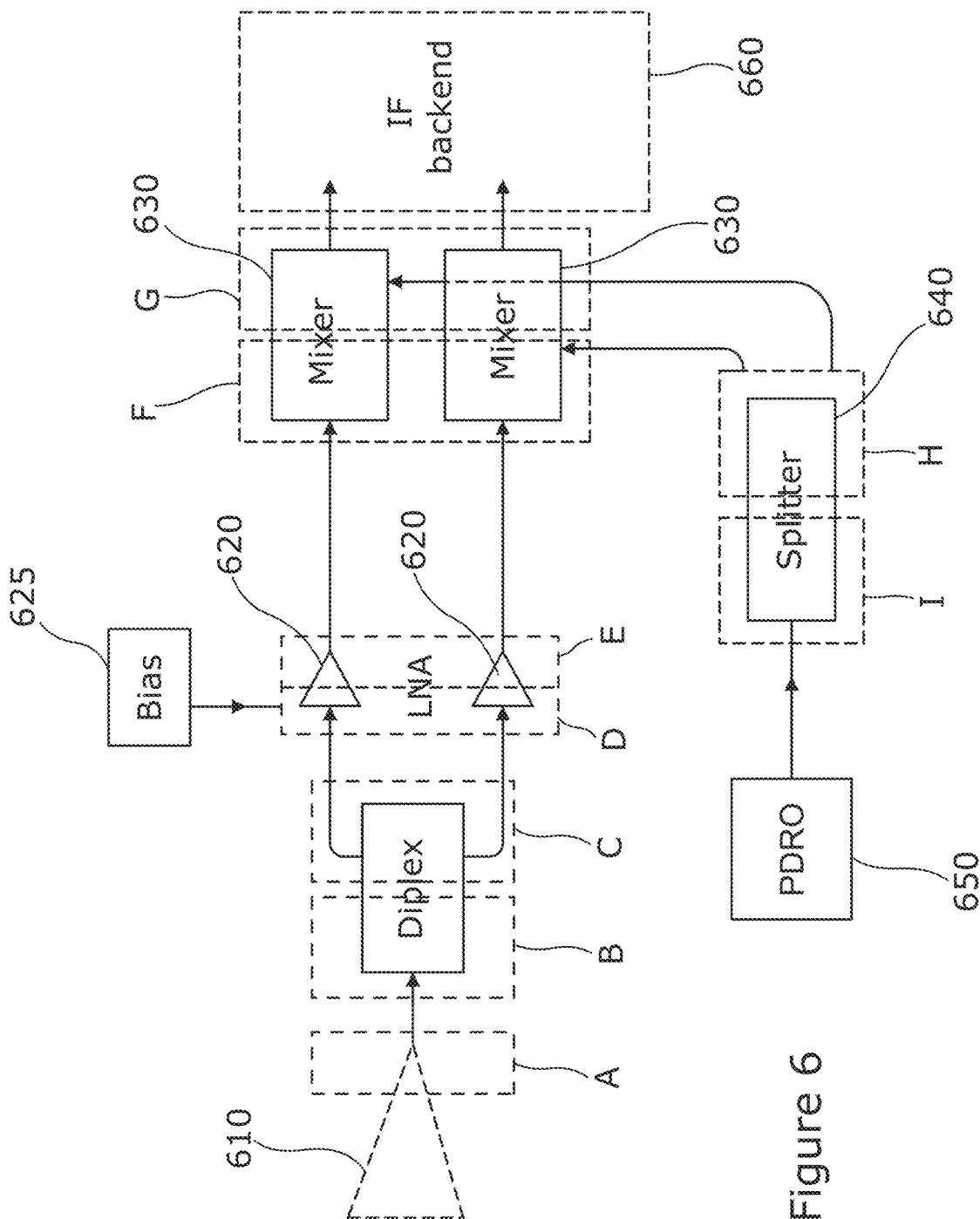
FIG. 6 shows schematically how the architecture of FIG. 1 may be used to implement a more complex, multiband heterodyne receiver module.

FIG. 6 illustrates schematically how a more complex heterodyne receiver may be implemented in an RF module similar to that of FIG. 1. In particular, FIG. 6 illustrates a multi-band receiver in which a waveguide diplexer is used prior to low noise amplification to split the received RF signal input into two bands, which can be further processed in the IF backend to generate quadrature inputs for a digital spectrometer. Suitable implementation of the receiver of FIG. 6 using a series of stacked plates as shown in FIG. 1 is illustrated by a broken line box corresponding to each such stacked plate, and labelled A-I which together form a circuit block 12.

The arrangement of FIG. 6 can be used for example in atmospheric monitoring by a satellite platform, in which radiation at oxygen and water vapor band frequencies of 60 GHz and 183 GHz are measured.

A multiband horn antenna 610 couples a received input RF signal into an aperture in the top plate A which in turn couples the input RF signal into plates B and C which implement a diplexer function, in which waveguides defined by plates B and C passively split the input RF signal into two streams. Each stream is separately directed through a corresponding entrance aperture in plate D into waveguides defined between plates D and E, where it is separately amplified using one of the two LNA amplifier integrated circuit processing components 620 located between plates D and E. These two processing components are both mounted within the circuit block 12 but on a suitable flexible PCB which connects the components to an LNA bias support circuit board 625 which may be stacked with the metal plates in the manner illustrated in FIG. 1.

Each output of the LNA amplifier components 620 is then separately directed through a corresponding entrance aperture in plate F into waveguides defined between plates F and G, where it is mixed using one of the two double sideband (DSB) mixer processing components 630. These DSB mixer processing components 630 may for example each be provided by one or more Schottky diodes each mounted on a suitable mixer microstrip circuit.

In the arrangement of FIG. 6, the DSB mixer processing components 630 are not directly coupled to any flexible PCB. Instead, separate local oscillator signals are provided through waveguides from a passive splitter function 640 implemented using waveguides between two more metal plates of the stack H and I, and communicating the local oscillator signals to the DSB mixer components using waveguides passing from plate H to plate G. In turn, the passive splitter function is fed a local oscillator signal through a flexible PCB by a phase locked dielectric resonator oscillator PDRO support circuit board 650 which is stacked with the metal plates in the manner illustrated in FIG. 1.

The outputs of the mixer components 630 are then each passed to IF backend 660 which may be implemented as a unit located in an aperture within the circuit block 12, for example as a low temperature co-fired ceramic package. In particular, the IF backend 660 may use a second downconverter to generate image and quadrature outputs fed to a digital spectrometer included in the IF backend package 660.

Figure 7:
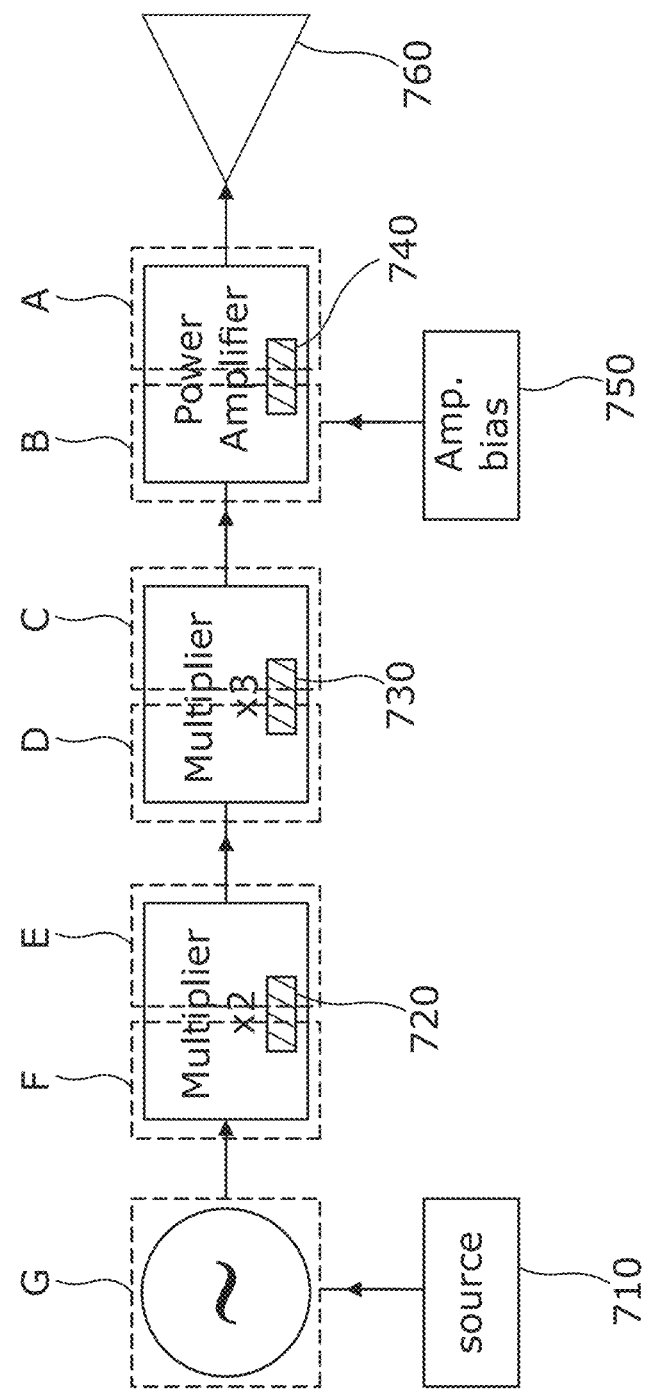
FIG. 7 shows schematically how the architecture of FIG. 1 may be used to implement a transmitter module.

FIG. 7 illustrates schematically how an active transmitter may be implemented in an RF module similar to that of FIG. 1. At millimeter and sub-millimeter wave frequencies, limited practical technologies are available for generating and detecting signals, leading to what is sometimes referred to as the terahertz gap. In FIG. 7 a cascade of multipliers is used to generate power at higher frequencies using a relatively lower frequency but high power source, using a stack of metal plates A-F and further support circuit boards configured in the manner illustrated in FIG. 1.

To this end, an RF source circuit board 710, which may be stacked with the metal plates A-F, generates a source frequency signal which is passed through a flexible PCB to a first metal plate G, to an injector processing component, such as a microstrip for coupling the source frequency signal into a waveguide of that plate. The waveguide in plate G then couples through to waveguides in plates F and E, between which a ×2 processing component 720 comprising a Schottky diode mounted on a quartz circuit board. The ×2 multiplier processing component receives the source frequency signal and outputs an RF signal or twice that frequency, which couples through waveguides of the plates E and F into waveguides of the plates C and D, and to a ×3 multiplier processing component 730 mounted within the circuit block 12 on a quartz circuit board. The active transmitter may comprise various combinations of such ×2 and ×3 multipliers, typically up to about ten in number, which then constitute a multiplier chain.

The tripled frequency output of the ×3 multiplier then outputs through waveguides of plates C and D into waveguides of plates A and B to be received by a power amplifier integrated circuit processing component 740 mounted within the circuit block on a flexible PCB coupling amplifier bias signals from an amplifier bias support circuit board 750. The amplified output of the amplifier component 740 then couples into further waveguides of plates A and B and into an antenna 760 which may be mounted directly onto the plate A, or coupled with an output waveguide aperture of plate A via one or more further waveguide structures.

In the arrangement of FIG. 7, as in other examples, one or more of the processing components may be coupled to the waveguides via suitable microstrip or other arrangements as appropriate.

Figure 8:
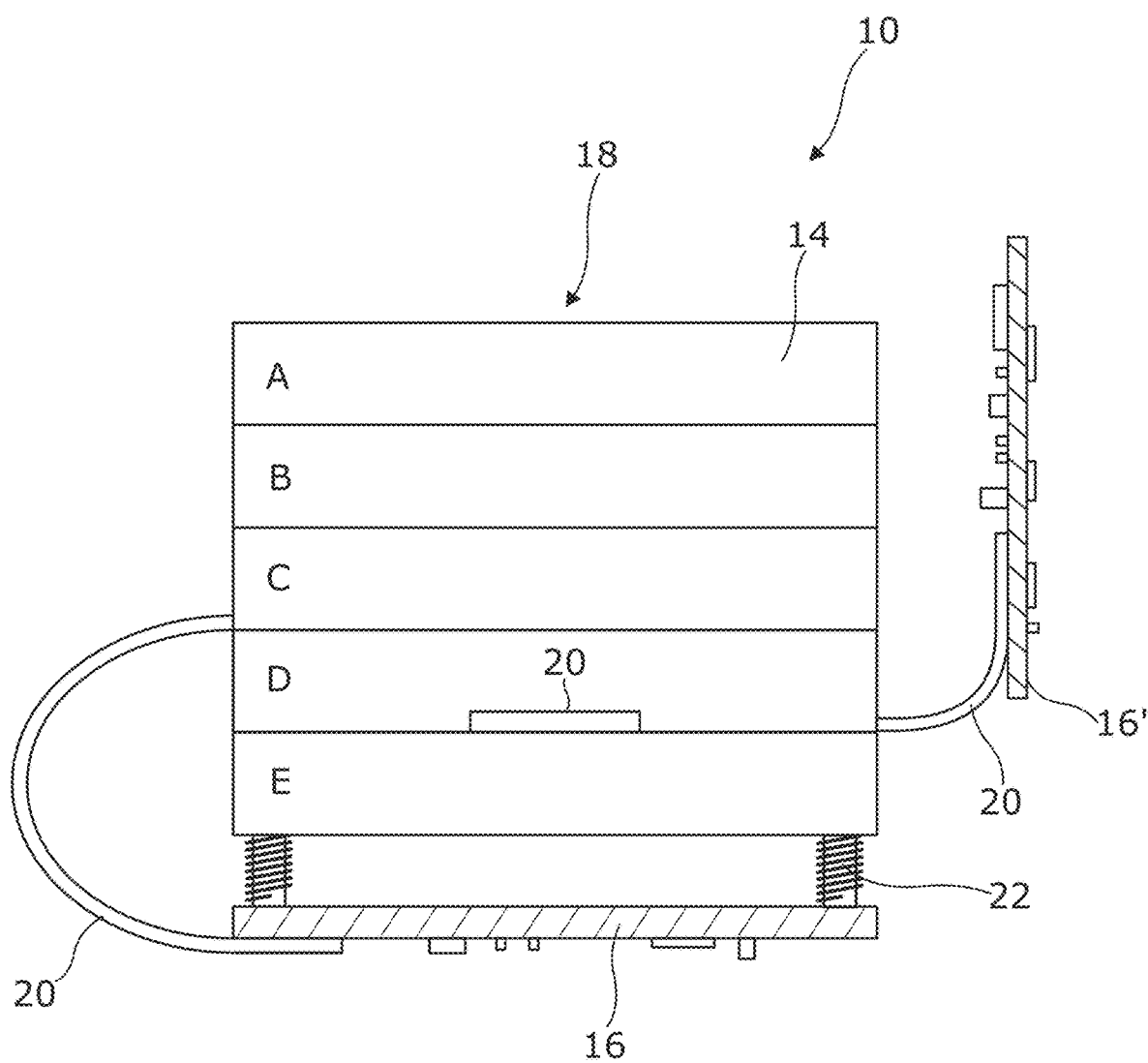
FIG. 8 illustrates in elevation view a variation of the module of FIG. 1 in which one of the support circuit boards is not stacked in series with the metal plates.

Although FIGS. 1 and 5 depict arrangements in which the support circuit boards 16 are stacked in series with the metal plates 14, in some embodiments one, more than one, or all of the support circuit boards 16 comprised in the radio frequency module 10 may be located at other positions not stacked with and/or not in series with the metal plates 14. These support circuit boards 16 may then be mounted directly to the metal plates for example using suitable brackets, or may be secured in other ways, for example to a sub frame of a satellite within which the radio frequency module 10 is installed. To this end, FIG. 8 depicts the radio frequency module 10 of FIG. 1 where one of the support circuit boards 16 is still stacked in series and parallel with the metal plates, in this instance using the mounting rods 22 as discussed above, and another one of the support circuit boards 16' is located away from and out of the stack, in this case in an orientation which is perpendicular to the stack. In such arrangements, any support circuit board 16' not stacked in series with the metal plates may still be electrically coupled into the circuit block using a flexible PCB 20 as shown in FIG. 8, or in other ways.

Such arrangements where one or more of the support circuit boards 16 are not stacked in series with the metal plates can have advantages in terms of enabling improved cooling or thermal control of such support circuit boards.

Although FIGS. 1, 5 and 8 depict arrangements in which both support circuit boards and flexible PCBs are provided as part of the radio frequency module 10, in some embodiments one or both of these component types are omitted. For example, FIG. 9 depicts one example of a radio frequency module 10 which does not include any support circuit boards (either stacked in series with the metal plates 14 or otherwise), and does not include any flexible PCB.

However, such arrangements may still benefit from various of the advantages described above for example by being implemented using at least three of the metal plates 14 to form the circuit block 12, with one or more of the radio frequency processing components being disposed with the circuit block 12 to interact with the radio frequency signals carried by the waveguides. In particular, referring to the mutual plate boundary defined by any two adjacent ones of the metal plates, such an embodiment may in particular use a plurality of radio frequency processing components, with a different one of the processing components being located at each of at least two, and optionally at all, of the plate boundaries.

Figure 9:
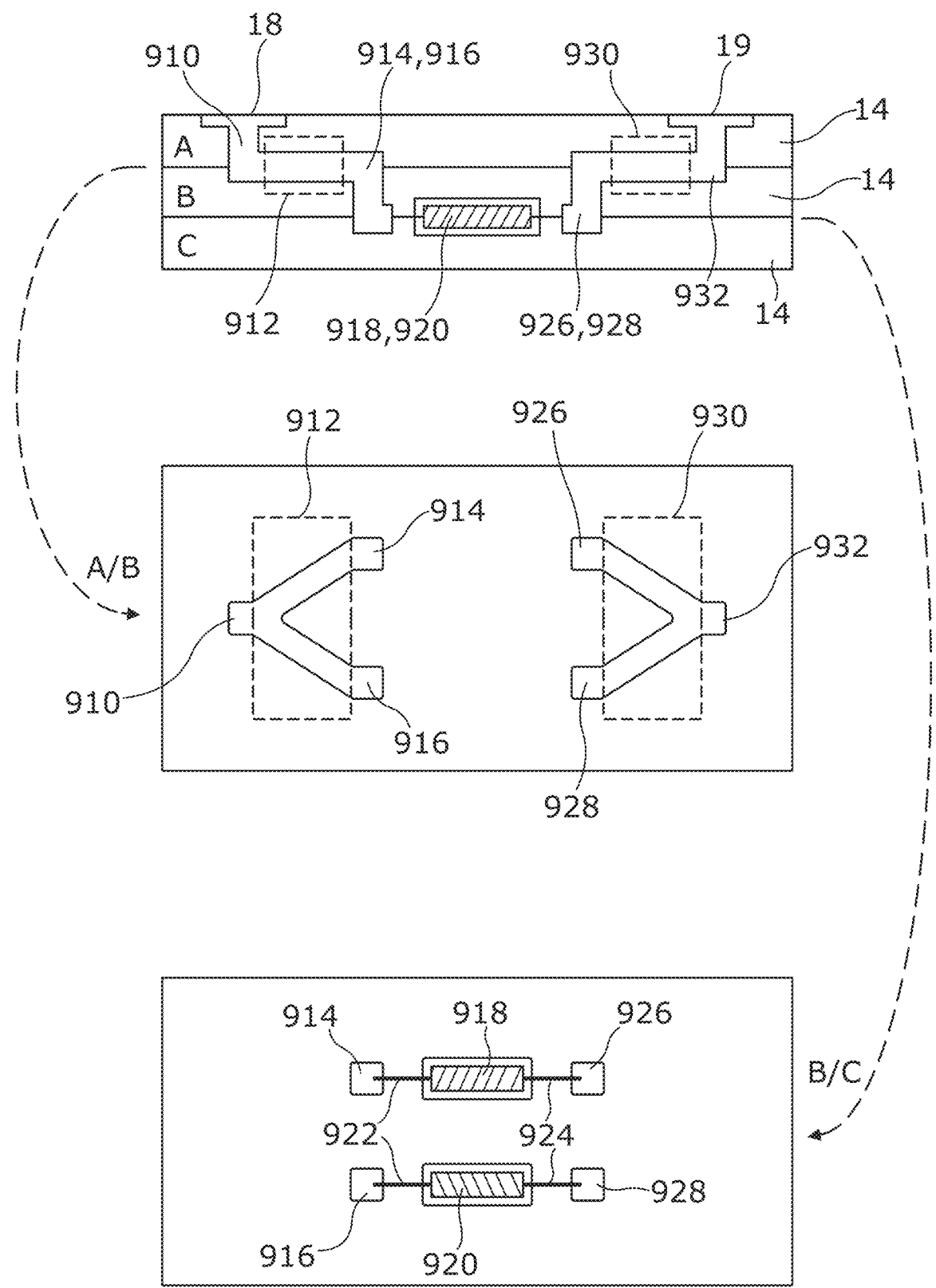
FIG. 9 shows in cross section a further radio frequency module using a circuit block of parallel metal plates, with the lower panels showing in plan view the boundaries between the metal plates.

To this end, the top part of FIG. 9 depicts in cross section a circuit block 12 comprising three of the already described parallel metal plates 14, here labelled A, B and C. The middle part of FIG. 9 then depicts in plan view the mutual boundary between plates A and B, and the lower part depicts in plan view the mutual boundary between plates B and C.

As can be seen from the top cross section view, the top plate A provides two upward facing microwave ports which comprise an entrance port 18 and an exit port 19, each of which could be coupled to a horn antenna, an external waveguide, or other arrangements for delivering microwaves to and collecting microwaves from the ports. A first waveguide 910 then couples from the entrance port 18 downwards to the boundary between plates A and B to couple into a power divider component 912 formed from a Y-shape waveguide structure located at the boundary between plates A and B.

The power divider component 912 serves to divide the microwave power received from the entrance port 18 and to direct it into two second waveguides 914, 916 which carry the divided power down through plate B to the mutual boundary with plate C. Here, the divided power is delivered, for amplification, to two separate active amplifier components 918, 920 which are located at the mutual boundary between plates B and C. The divided microwave power may be coupled from each second waveguide 914, 916 into the respective active amplifier components 918, 920 by use of strip lines 922 extending from the amplifier components into the second waveguides 914, 916.

The amplifier components 918, 920 then output the amplified microwave power, for example through further strip lines 924, into respective third waveguides 926, 928, which carry the amplified microwave power up through plate B to a power combiner 930 formed from a suitable Y-shaped waveguide structure located at the boundary between plates A and B. the power combiner 930 combines the microwave power from the third waveguides 926, 928 for output into a fourth waveguide 932 which couples the combined power upwards through plate A to the exit port 19.

If required, one or more flexible PCBs (not shown) can be used to couple the active amplifier components 918, 920 to suitable circuitry located outside of the circuit block 12, for example suitable power supply, bias, and/or control circuitry which may be located partly on the flexible PCB(s) if required, and/or on suitable support circuit boards (not shown). However, such electrical connections to the active amplifier components may be made in other ways, and some such circuitry for servicing the amplifier components may be provided for example using circuit boards located wholly within the circuit block 12.

In FIG. 9, the power divider 912 and power combiner 930 permit an input microwave signal to be amplified using two separate active amplifier components 918, 920, for example to enable higher amplification levels to be achieved using available components, to assist with thermal control and for other reasons. Note that instead of using just two active amplifier components, the input microwave power may be divided amongst a larger number of amplifiers by using multiple levels of dividers and combiners, or in other ways. Although simple three port waveguide combiners and dividers are shown in the figure, four port directional and/or hybrid couplers could be used.

Although some particular radio frequency processing components, in particular the power divider, amplifier components, and power combiner, are used in the arrangement of FIG. 9, other arrangements of the radio frequency module 10 may use different combinations of components. When the location of a radio frequency component at a boundary between two plates is mentioned, it is not necessary for the component to be disposed across the major plane of the boundary between the plates, rather such a component could instead be located wholly within a suitable aperture of one of the plates, in particular where that aperture is open to the other plate forming the mutual boundary.

Although in FIG. 9 a particular combination of radio frequency components located at each of at least two boundaries of the metal plates of a stack are shown, various other radio frequency circuits may be constructed in a similar manner using three or more such metal plates, active and/or passive radio frequency components, and waveguide structures within and between the plates. The various aspects described in respect of the arrangements of FIGS. 1, 5 and 8 such as the stacking or other positioning of support circuit boards, the use of mounting rods, form factors, sizes and alignments of the metal plates and any support circuit boards, and so forth, also apply to the arrangement of FIG. 9.

Although FIGS. 1, 5, 8 and 9 depict arrangements in which three or more metal plates 14 are stacked to form the circuit block 12, in some embodiments as few as two such metal plates 14 may be used, with a plurality of radio frequency waveguides being defined by channels in the two or more metal plates so as to carry radio frequency signals within the circuit block. One or more radio frequency processing components are then arranged within the circuit block to interact with the signals carried by the waveguides. In such arrangements, one or more flexible printed circuit boards may then be provided, wherein each such flexible printed circuit board is arranged to provide external electrical communication with at least one of the processing components, by said flexible printed circuit board extending from the circuit block, or more particularly from the inside of the circuit block, to outside of the circuit block.

Figure 10:
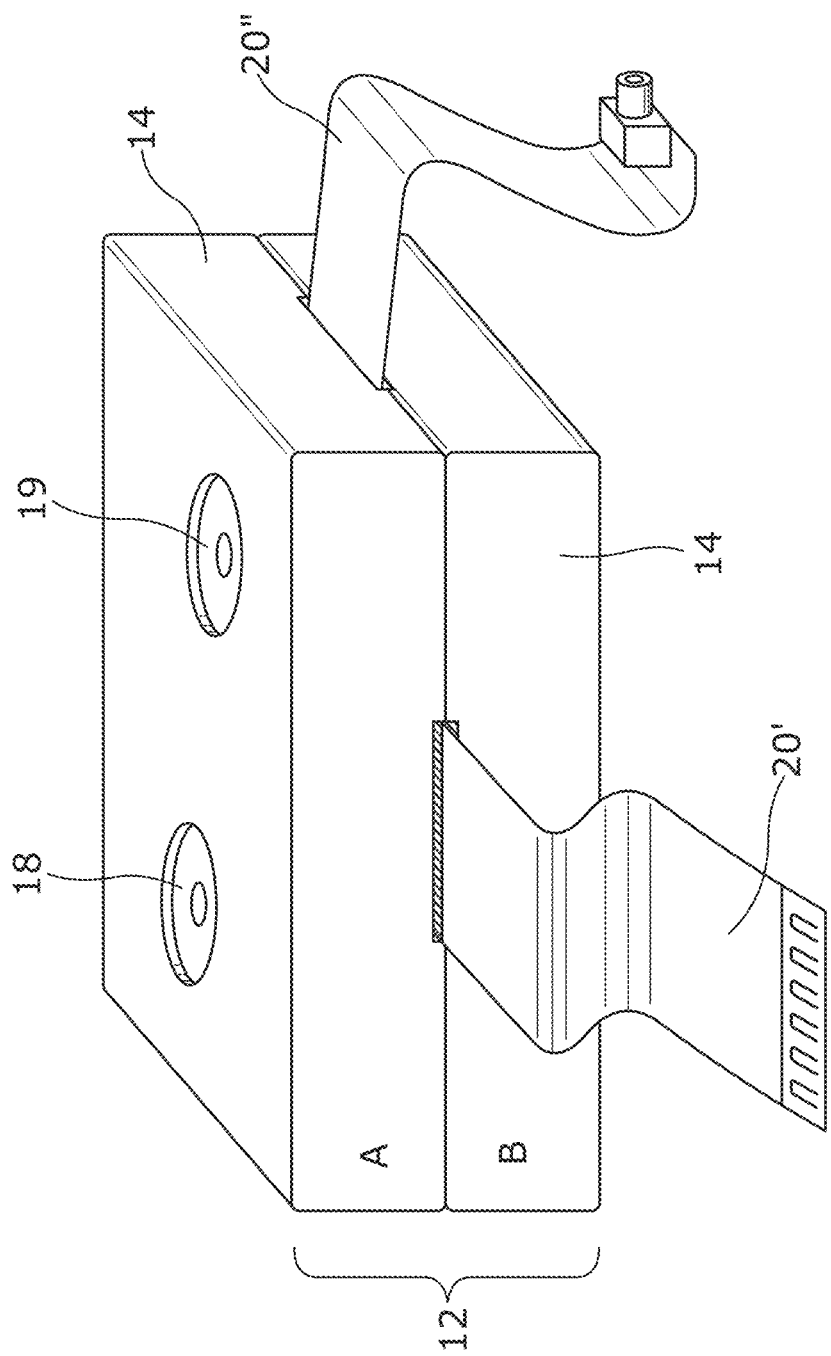
FIG. 10 shows in perspective view a further radio frequency module using flexible PCBs to provide electrical communication for example of data, power, and/or RF signals between the inside and the outside of the circuit block.

FIG. 10 depicts a variation of the radio frequency module 10 discussed above in which only two metal plates 14 are used to form the radio frequency circuit block 12 containing a plurality of radio frequency waveguides (not shown in FIG. 10) defined by channels in the metal plates, and one or more radio frequency processing components (not shown in FIG. 10) arranged within the circuit block 12 to interact with the signals carried by the waveguides. Variations of this embodiment could comprise more than two such metal plates if required, for example three, four or more metal plates.

In this embodiment, one or more flexible PCBs extend from the inside to the outside of the circuit block, and may be used for various purposes. For example a first flexible PCB 20' may carry power into, and/or carry data or control signals to or from, processing components located within the circuit block, and may connect to a support circuit board 16 external to the circuit block, or to some other element not comprised in the radio frequency module such as to further circuitry, data or power facilities, or another radio frequency module. Typically, each such flexible PCB extends from the inside to the outside of the circuit block at a boundary between a pair of adjacent ones of the metal plates, through an aperture or slot defined between the pair of metal plates as shown in FIG. 10. Such apertures or slots may correspond to the apertures 234,332,352 already shown and described in respect of FIGS. 1, 3 and 4.

A second flexible PCB 20″ may carry an RF signal into and/or out of the circuit block, to or from RF components located with the circuit block, and to that end may comprise one or more coaxial or other RF connectors 970 for making such RF connections.

In some variations of this embodiment, one or more of the flexible PCBs may connect from one inside portion of the circuit block to another inside portion of the circuit block, by extending through an aperture or slot between a first pair of adjacent ones of the metal plates, and also extending through an aperture or slot between a second pair of adjacent ones of the metal plates. The first and second pairs are typically different pairs of the metal plates so that the flexible PCB then connects between different levels or different metal plate boundaries of the circuit block.

The radio frequency module 10 of FIG. 10 may also comprise one or more radio frequency entrance ports 18 and/or exit ports 19 for example as depicted in earlier figures, may include one or more support circuit boards, and include various other features of the described radio frequency modules discussed above.

In some embodiments, a radio frequency module 10 according to this disclosure may combine both transmitter and receiver functions within a single circuit block and associated support circuit boards. In other embodiments, transmitter and receiver functions may be located adjacent or near to each other using separate such stacks and support circuit boards for each.

Because of the compact nature and geometry of the described radio frequency modules 10, a plurality of such modules may be located adjacent to each other in a grid, for example in a rectilinear or hexagonal grid, and in particular to implement a phased array, which can be used to steer a beam of such an array by suitable control of the separate modules. Such a phased array may implement a phased array transmitter being formed of an array of transmitter modules, a phased array receiver being formed of an array of receiver modules, or a phased array transceiver being formed either of an array of transceiver modules, or an array comprising both transmitter and receiver modules.

FIG. 11 illustrates schematically how such a phase array might be structured. In FIG. 8 there are five radio frequency modules forming a one dimensional linear array, but any number of such modules may be used in such a one dimension, or in a two dimensional array. Each radio frequency module 810 comprises a radio frequency circuit block 815 which comprises a stack of at least three parallel metal plates and a plurality of radio frequency waveguides defined by channels in the metal plates so as to carry radio frequency signals within the circuit block, as already described above. One or more radio frequency processing components are then arranged within the circuit block to interact with the signals carried by the waveguides, and one or more support circuit boards 820 are disposed parallel to and stacked in series with the metal plates, each support circuit board being in electrical communication with at least one of the processing components.

Each radio frequency module 810 may include or be associated with a separate antenna unit 825, such as a horn antenna, optionally mounted to the module itself.

In FIG. 11, each radio frequency module 810 is coupled to a separate steering element 830 which controls a phase timing of radio frequency signals either transmitted from the associated radio frequency module, or controls a phase timing (for example by using a suitable phase delay) of radio frequency signals received then output by the associated radio frequency module. However, these steering elements could be implemented using support circuit boards of the radio frequency modules themselves, or elsewhere for example within the illustrated control unit 850. The control unit 850 may be responsible for controlling the steering elements 830 to implement the required mean steering, as well as controlling timing of radio frequency transmissions and/or suitably combining received radio frequency signals.

Although the detailed embodiments as described demonstrate some particular RF systems which may be implemented using the described architectures, the illustrated principles are advantageous in their flexibility and usefulness to implement a wide variety of functions in a radio frequency module as generally described, such as:

heterodyne receivers and radiometers;
heterodyne multi-band receivers and radiometers;
transmitters;
radar modules combining both transmitter and receiver function in a single RF module;
phased arrays of such modules, combinations of one or more transmitter RF modules with one or more receiver RF modules;
RF direct detection receivers, without the RF down conversion used in heterodyne receivers;
RF/THz broadband detectors used in RF/THz sensing applications such as in security, biological, drugs and explosion detection, imaging, and astronomy.

Noting the above particular RF systems, these may be used for a wide range of applications including both active and passive meteorological sensing (for example of water vapor, temperature and so forth), radar applications such as in military, aviation, ground vehicle, shipping, altimeter and other areas, and telecommunications of various types. In some applications where beam focus and/or steering are required, the described RF modules may be combined into phased arrays.

The RF modules may be used for example on an orbiting satellite, an aircraft, a high altitude balloon, a radar installation, a ship or land vehicle, or by any of a variety of other moving or static platforms.

Similarly, although the detailed embodiments as described implement various functional subsystems which operate together in a single RF module 10 to implement a particular application, the potential range of such functional subsystems is very wide, including for example:

low noise amplifiers (LNAs), which are typically the first active subsystem, in a receiver chain. An LNA amplifies very low power signal without significantly degrading the signal to noise ratio. An LNA will amplify the signal and noise present at its input, with minimum additional noise. For this, the active device processing component (for example MMIC chip, transistors) in the LNA should be input matched to achieve the optimum noise and output matched for maximum power transfer to the RF circuit. LNA amplifies very low power signal, usually from an antenna where signals are barely recognisable;
power signal, usually from an antenna where signals are barely recognizable; high power, transmittable output;
mixers, typically with an RF input signal and a local oscillator input, providing an intermediate frequency (IF) output, with the local oscillator input being provided by a waveguide input or a flexible PCB input depending on the frequency of operation. At LO frequencies below 30 GHz flexible PCBs may be preferred for this, although at higher LO frequencies waveguides may be required for interconnection to reduce the insertion losses. The processing component(s) within the circuit block of such a mixer may be provided by one or more Schottky diodes soldered on to a quartz circuit which contains the input and output matching circuits and waveguides to microstrip transitions. The quartz circuit may then be dropped into a channel in one of the metal plates, and the output IF delivered to a support circuit board via a flexible PCB, or more directly to an IF backend housed within the stack of metal plates;

multipliers which may also be provided using an input/output matching circuit and waveguide to microstrip transitions fabricated on quartz substrate which is dropped into a channel in the stack of metal plates. The input and outputs can be implemented either using waveguides or by coupling to flexible PCBs depending on the frequency of operation required;

splitters, for example T-junction and Y-junction splitters implemented using waveguides within the circuit block 12. A Y-junction splitter for example may have an input waveguide, two output waveguides and an interconnecting waveguide transition in between the input and output. The complete splitter can be integrated into two adjacent metal plates within the circuit block;

local oscillators. Although in the described embodiments, some local oscillators may be implemented on board a support circuit board, in other instances a local oscillator may be implemented using one or more processing components such as a frequency synthesizer chip and associated circuitries, which are mounted within the circuit block. Required bias signals can then be supplied via a flexible PCB. High frequency local oscillators might also need multipliers to follow the synthesizer, which can be constructed using processing components in the same or other layers in the stack of metal plates;

antennae—simple antennas can be mounted to or integrated into one or more layers in the stack of metal plates, such as a pyramidal horn, enabling an RF signal received by the antenna to be closely integrated to other functions implemented in the circuit block such as an LNA and one or more mixer circuits;

bias circuits can be implemented using bias modules and circuitries in more than one layer in the circuit block and/or in support circuit boards, based on DC requirements for other components in the module.

Although various particular radio frequency processing components for locating within the circuit block 12 to provide different functionalities and interactions with RF signals in the waveguides have been described in the detailed embodiments, a wide range of other different processing components may be used to fulfil a wide range of different functions. For example, processing components may be any of:

active electronic components, typically requiring a power supply, for example Schottky or PIN diode and other solid state switches. Active electronic components may also be provided as integrated circuits including IF LNA, RF LNA, IQ Mixer chips, amplifier chips, filter chips, and typically implemented using MMIC technology;

discrete electronic components such as Schottky diodes, PIN diodes, resistors, inductors, capacitors, a temperature sensor, a resistor network, and circuits formed of such components and combinations;

micro electrical mechanical (MEMS) devices, for example to selectively redirect waveguide signals into different waveguides;

combiners, dividers and mixers of various types, formed using transmission lines, waveguide structures or in other ways, including for example transmission line or waveguide directional couplers; transmission line or waveguide hybrid couplers; transmission line or waveguide power dividers; and transmission line or waveguide power combiners.

combinations of any of the above.

In the detailed embodiments, the use of various modes and means of interconnectivity between different functional and physical parts of the described RF modules have been mentioned, but both these and a wide range of interconnection schemes and methods may be used for radio frequency, intermediate frequency, control and other signals within the modules, including:

waveguide interconnections, for example including waveguide input and output connections to/from an RF module for example from/to an antenna or other such module;

flexible PCB connections. Such flexible PCBs may be manufactured for example using a 50 μm polyimide flex, an 18 μm copper layer for track formation, a 25 μm PI coverlay, stiffener as required to 300 μm total thickness with an ENEPIG surface finish more generally the flexible PCB connections may be adapted to bend, or indeed be implemented in a module 10 to bend with curvature radius of less than 10 mm for example, and may for example have a thickness of less than 1 mm or less than 500 μm;

coaxial connections, for example between an RF module as described and other system components such as dc/low RF frequency filters, amplifiers, mixers etc.;

—planar circuits such as quartz microstrip and stripline circuits, which are particularly of use within the circuit block 12 itself, and notably for coupling RF signals between the waveguides and electrical circuits including associated processing components.

Although specific embodiments of the invention have been described with reference to the drawings, the skilled person will be aware that variations and modifications may be applied to these embodiments without departing from the scope of the invention defined in the claims. For example, the described RF modules may comprise integrated silicon substrate lenses for focusing signals on to Schottky diode circuitry used for RF/THz detection, integrated waveguide resonant cavities for use in material characterization, and so forth.

The invention claimed is:

1. A radio frequency module comprising:
a radio frequency circuit block having an inside and an outside, the radio frequency block comprising a stack of at least two metal plates and a plurality of radio frequency waveguides defined by channels in one or more of the at least two metal plates so as to carry radio frequency signals within the circuit block;
one or more radio frequency processing components arranged within the circuit block to interact with the signals carried by the waveguides; and
one or more flexible printed circuit boards extending from the outside to the inside of the radio frequency circuit block, wherein each of the one or more radio frequency processing components is mounted on one of the one or more flexible printed circuit boards within the radio frequency circuit block.

2. The radio frequency module of claim 1, further comprising one or more support circuit boards, each of the one or more support circuit boards being in electrical communication with at least one of the one or more radio frequency processing components.

3. The radio frequency module of claim 2, wherein at least one of the one or more support circuit boards is stacked in series with the at least two metal plates.

4. The radio frequency module of claim 3, wherein all of the one or more support circuit boards are stacked in series with the at least two metal plates.

5. The radio frequency module of claim 1, wherein the circuit block comprises a stack of at least three of the at least two metal plates.

6. The radio frequency module of claim 5, wherein each adjacent pair of the at least two metal plates in the stack defines a mutual plate boundary, and at least one of the one or more radio frequency processing components is located at each of at least two of the mutual plate boundaries.

7. The radio frequency module of claim 1, wherein at least three of the at least two metal plates define at least part of at least one of the waveguides.

8. The radio frequency module of claim 2 wherein each metal plate of the stack overlaps with all the others by at least 90% surface area in plan view, and each of one or more of the one or more support circuit boards also overlaps with all of the metal plates of the stack by at least 90% surface area in plan view.

9. The radio frequency module of claim 1, wherein one or more of the one or more flexible printed circuit boards has a curvature with a radius of less than 100 mm.

10. The radio frequency module of claim 2, wherein each of the one or more support circuit boards is in electrical communication with at least one of the one or more radio frequency processing components via one of said one or more flexible printed circuit boards extending from the support circuit board into the radio frequency circuit block.

11. The radio frequency module of claim 1, wherein the radio frequency module is one or more of a receiver module, a heterodyne receiver module, a transmitter module, a transceiver module, and an amplifier module.

12. The radio frequency module of claim 1, further comprising a plurality of mounting rods, each mounting rod passing through a series of aligned apertures in all of the at least two metal plates.

13. The radio frequency module of claim 3 further comprising a plurality of mounting rods, each mounting rod passing through a series of aligned apertures in all of the at least two metal plates, wherein, each of the plurality of mounting rods also passes through a corresponding mounting aperture in each of the one or more support circuit boards stacked in series with the at least two metal plates.

14. The radio frequency module of claim 1, wherein each of the at least two metal plate has a same form factor as the other metal plates.

15. The radio frequency module of claim 3 14, wherein each of the at least two metal plates has a same form factor as the other metal plates, and some or all of the at least one of the one or more support circuit boards stacked in series with the at least two metal plates have the same form factor as the at least two metal plates.

16. The radio frequency module of claim 1, wherein each of the at least two metal plates of the stack overlaps with all the others by at least 90% surface area in plan view.

17. The radio frequency module of claim 1, wherein the major surface of each of the at least two metal plates has a surface area of not more than 25 cm$^2$.

18. The radio frequency module of claim 3, wherein the depth of the stack of at least two metal plates, in combination with the at least one or more support circuit boards stacked in series with the at least two metal plates, is no more than 10 cm.

19. The radio frequency module of claim 1, wherein the radio frequency signals have frequencies in the range 10 GHz to 400 GHz.

20. The radio frequency module of claim 1, wherein one or more of the one or more radio frequency processing components are coupled to one or more of the waveguides using one or more microstrip circuits located within the radio frequency circuit block.

21. The radio frequency module of claim 1, wherein the one or more radio frequency processing components comprise one or more of: a passive component, a discrete diode, a combination of discrete diodes, a resistor or resistor network, an inductor, and a capacitor.

22. The radio frequency module of claim 1, wherein the one or more radio frequency processing components comprise one or more of: a transmission line or waveguide directional coupler; a transmission line or waveguide hybrid coupler; a transmission line or waveguide power divider; and a transmission line or waveguide power combiner.

23. The radio frequency module of claim 1, wherein the one or more radio frequency processing components comprise one or more of: an active component, a transistor, an amplifier integrated circuit, a mixer integrated circuit, a filter integrated circuit, and a MEMS device.

24. The radio frequency module of claim 1, wherein the one or more radio frequency processing components are arranged to implement within the circuit block one or more of: an amplifier, a mixer, a frequency multiplier, and a phase shifter.

25. A phased array comprising a plurality of the radio frequency modules of claim 1.

26. A method of constructing a radio frequency module comprising:
stacking a plurality of metal plates to form a radio frequency circuit block having an inside and outside, the radio frequency circuit block comprising a plurality of radio frequency waveguides defined by channels in at least one of the plurality of metal plates so as to carry radio frequency signals within the radio frequency circuit block, while disposing one or more radio frequency processing components within the circuit block to interact with the signals carried by the waveguides; and
providing one or more flexible printed circuit boards extending from the inside to the outside of the radio frequency circuit block, wherein each of the one or more radio frequency processing components is mounted on one of the one or more flexible printed circuit boards within the radio frequency circuit block.

27. The method of claim 26, further comprising mounting one or more support circuit boards stacked in series with the plurality of metal plates, each support circuit board being in electrical communication with at least one of the one or more radio frequency processing components.

28. The method of claim 27, further comprising providing electrical communication between one or more of the one or more support circuit boards and one or more of the one or more radio frequency processing components using one or more of the one or more flexible printed circuit boards extending into the radio frequency circuit block.

29. A frequency module comprising:
- a radio frequency circuit block having an inside and an outside, the radio frequency block comprising a stack of at least three metal plates and a plurality of radio frequency waveguides defined by channels in one or more of the at least three metal plates so as to carry radio frequency signals within the circuit block;
- one or more radio frequency processing components arranged within the circuit block to interact with the signals carried by the waveguides;
- one or more support circuit boards, each of the one or more support circuit boards being in electrical communication with at least one of the radio frequency processing components; and
- one or more flexible printed circuit boards extending from the outside to the inside of the circuit block, wherein each of the support circuit boards is in electrical communication with at least one of the one or more radio frequency processing components via one of the one or more flexible printed circuit boards extending from the support circuit board.

30. The radio frequency module of claim 29 wherein the one or more support circuit boards are stacked in series with the stack of at least three metal plates.

31. The radio frequency module of claim 29 wherein each adjacent pair of metal plates in the stack of at least three metal plates defines a mutual plate boundary, and at least one of the radio frequency processing components is located at each of at least two of the mutual plate boundaries.

* * * * *

UNITED STATES PATENT AND TRADEMARK OFFICE
CERTIFICATE OF CORRECTION

PATENT NO. : 12,469,943 B2
APPLICATION NO. : 18/271272
DATED : November 11, 2025
INVENTOR(S) : Kai Parow-Souchon and Manju Henry Page 1 of 1

It is certified that error appears in the above-identified patent and that said Letters Patent is hereby corrected as shown below:

In the Claims

Column 19, Claim 15, Line 62:
Please remove the number 14

Signed and Sealed this
Twenty-third Day of December, 2025

John A. Squires
*Director of the United States Patent and Trademark Office*